US012618987B2

(12) United States Patent　　(10) Patent No.: US 12,618,987 B2
Ishikura　　(45) Date of Patent: May 5, 2026

(54) RADIATION DETECTION ELEMENT, RADIATION DETECTOR, RADIATION DETECTION DEVICE, AND METHOD FOR MANUFACTURING RADIATION DETECTION ELEMENT

(71) Applicant: HORIBA, LTD., Kyoto (JP)

(72) Inventor: Koji Ishikura, Kyoto (JP)

(73) Assignee: HORIBA, LTD., Kyoto (JP)

( * ) Notice: Subject to any disclaimer, the term of this patent is extended or adjusted under 35 U.S.C. 154(b) by 176 days.

(21) Appl. No.: 18/681,896

(22) PCT Filed: Aug. 18, 2022

(86) PCT No.: PCT/JP2022/031152
§ 371 (c)(1),
(2) Date: Feb. 7, 2024

(87) PCT Pub. No.: WO2023/026939
PCT Pub. Date: Mar. 2, 2023

(65) Prior Publication Data

US 2025/0224526 A1　　Jul. 10, 2025

(30) Foreign Application Priority Data

Aug. 25, 2021　(JP) ................................. 2021-137296

(51) Int. Cl.
*G01T 1/24*　　(2006.01)
*G01N 23/223*　　(2006.01)
(Continued)

(52) U.S. Cl.
CPC ........... *G01T 1/241* (2013.01); *G01N 23/223* (2013.01); *H10F 39/014* (2025.01); *H10F 39/1892* (2025.01)

(58) Field of Classification Search
CPC ............................ G01T 1/241; H10F 39/1892
See application file for complete search history.

(56) References Cited

U.S. PATENT DOCUMENTS 10,163,957 B2 * 12/2018 Von Känel ............ H10F 39/018
2009/0283776 A1 * 11/2009 Iwamuro .............. H10D 30/665
438/584
(Continued)

FOREIGN PATENT DOCUMENTS

JP　　2011-14718 A　　1/2011
JP　　2012-154933 A　　8/2012
(Continued)

OTHER PUBLICATIONS

International Search Report for the corresponding International Patent Application No. PCT/JP2022/031152, mailed Oct. 25, 2022, with English translation, 7 pages.

*Primary Examiner* — Hugh Maupin
(74) *Attorney, Agent, or Firm* — LUCAS & MERCANTI, LLP

(57) ABSTRACT

A radiation detection element includes: a semiconductor part including an incidence surface to which radiations to be detected are incident; a first electrode provided on the incidence surface; and a second electrode that is provided on the incidence surface and is disposed at a position surrounding the periphery of the first electrode. The radiation detection element is a silicon drift-type radiation detection element, and is provided with an insulating protective film that covers the second electrode.

11 Claims, 11 Drawing Sheets

(51) Int. Cl.
    *H10F 39/00*          (2025.01)
    *H10F 39/18*          (2025.01)

(56)             References Cited

U.S. PATENT DOCUMENTS

| | | | |
|---|---|---|---|
| 2010/0314706 A1 | 12/2010 | Hullinger et al. | |
| 2011/0012216 A1* | 1/2011 | Morichi | G01T 1/2928 |
| | | | 438/69 |
| 2013/0022166 A1* | 1/2013 | Drummy | G01N 23/223 |
| | | | 378/44 |
| 2013/0153962 A1 | 6/2013 | Sim et al. | |
| 2014/0124665 A1* | 5/2014 | Yasui | G01N 23/223 |
| | | | 250/370.15 |
| 2014/0353786 A1 | 12/2014 | Andersson et al. | |
| 2016/0313459 A1* | 10/2016 | Scoullar | G06F 30/20 |
| 2020/0313022 A1 | 10/2020 | Sim | |
| 2020/0355837 A1 | 11/2020 | Matsunaga et al. | |
| 2021/0175369 A1* | 6/2021 | Ohse | H10D 64/64 |
| 2022/0093814 A1 | 3/2022 | Matsunaga et al. | |
| 2024/0290904 A1* | 8/2024 | Andersson | H10F 30/29 |

FOREIGN PATENT DOCUMENTS

| | | | |
|---|---|---|---|
| JP | 2014-235167 A | 12/2014 | |
| WO | 2019/117272 A1 | 6/2019 | |
| WO | 2020/162246 A1 | 8/2020 | |

* cited by examiner

F I G . 1
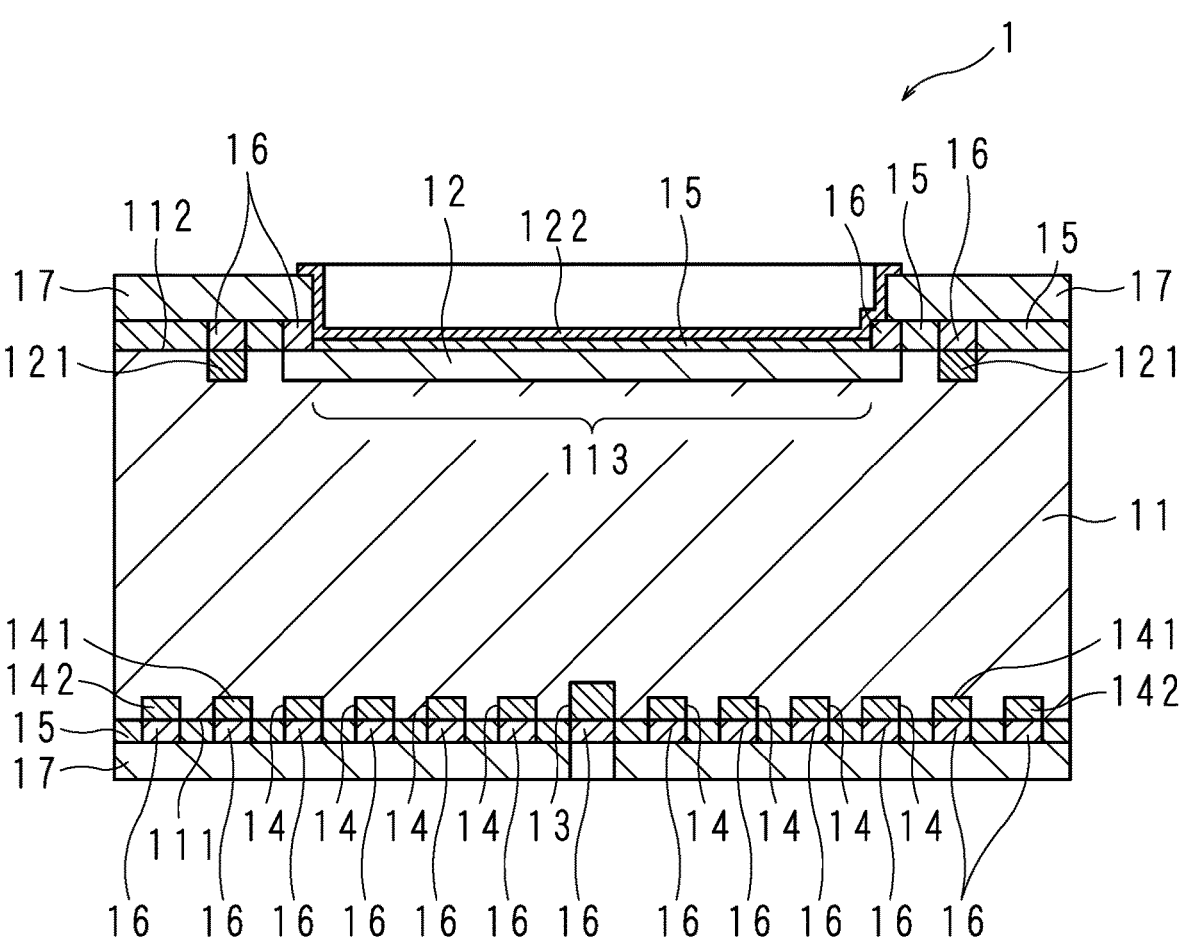

F I G.2
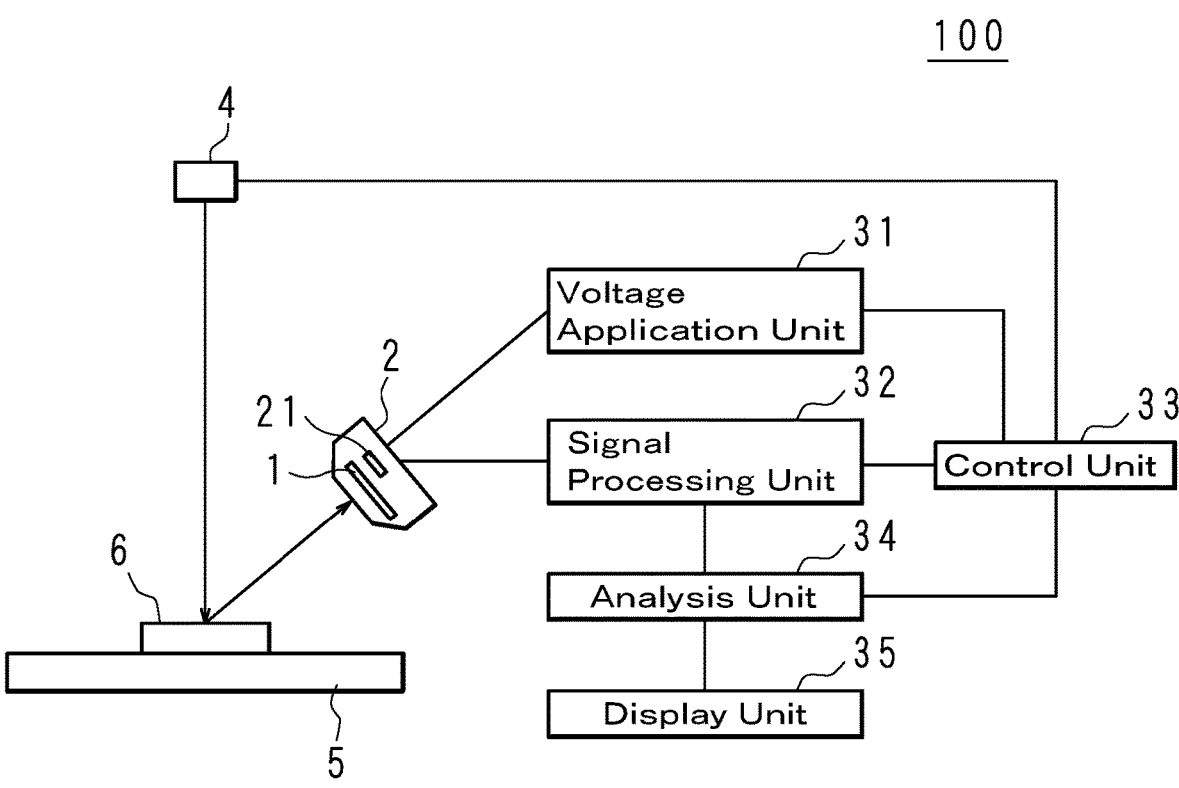

F I G . 3
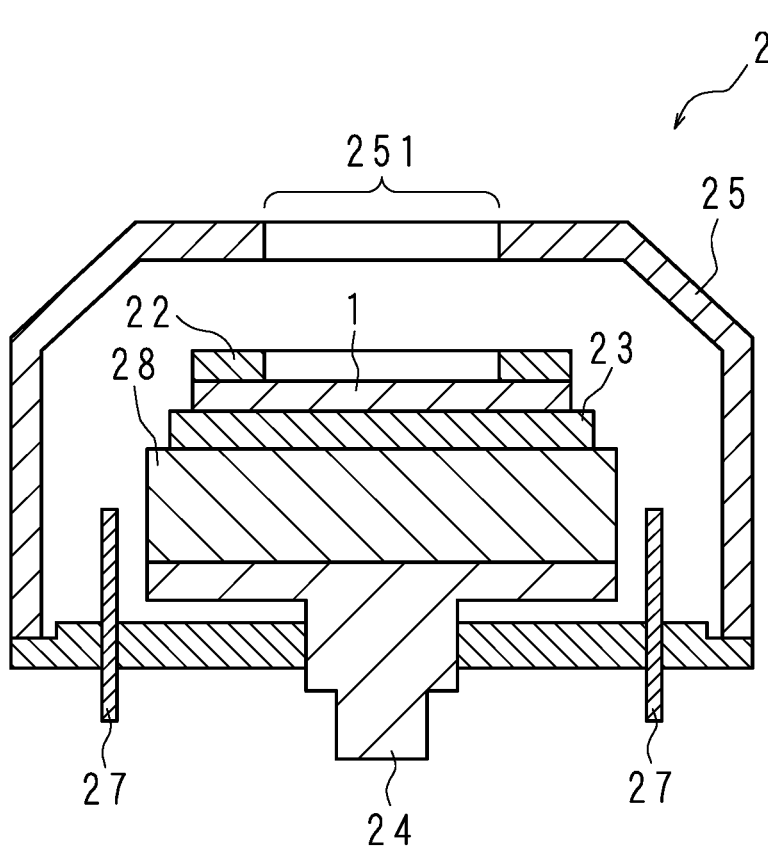

F I G.4
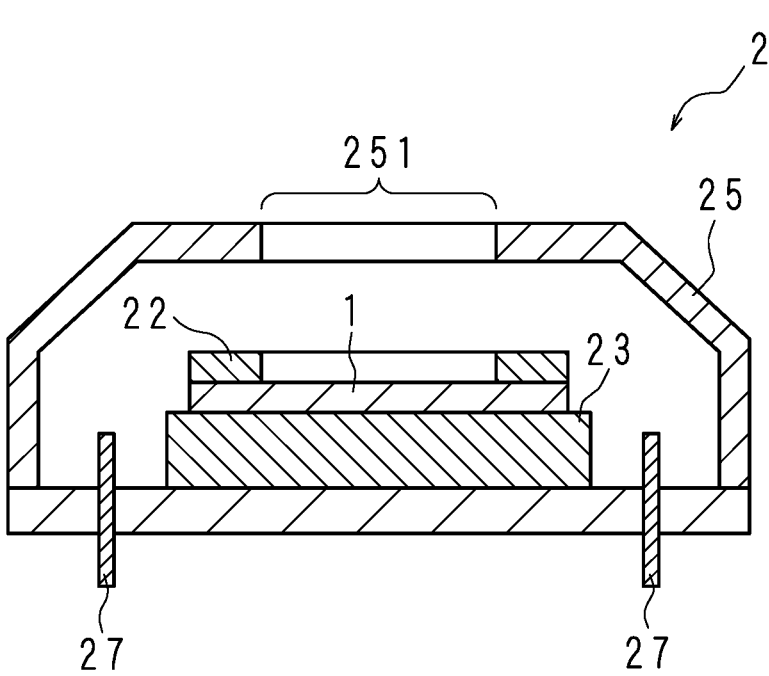

F I G.5 A
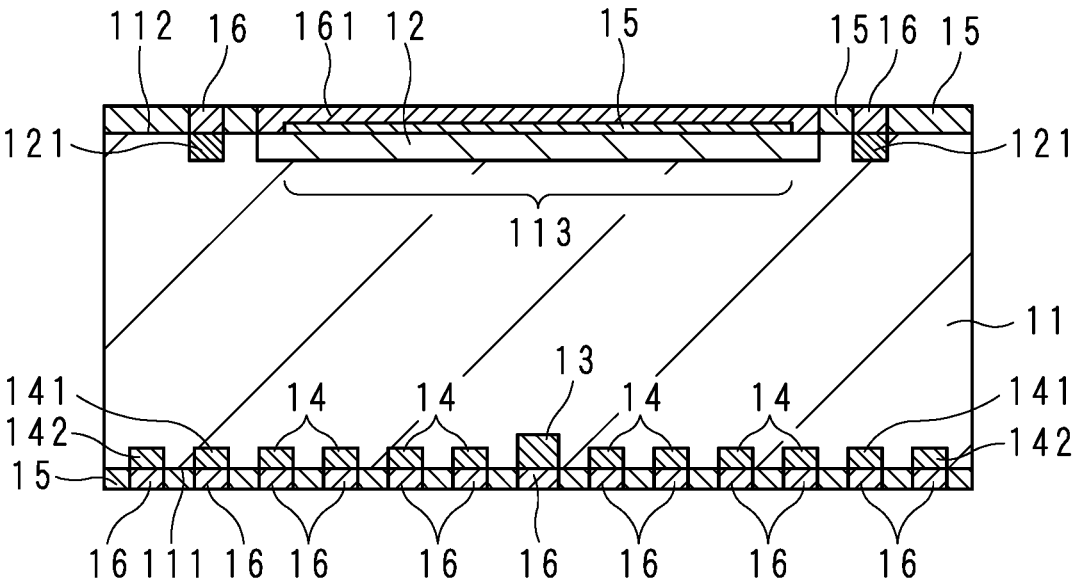
F I G.5 B
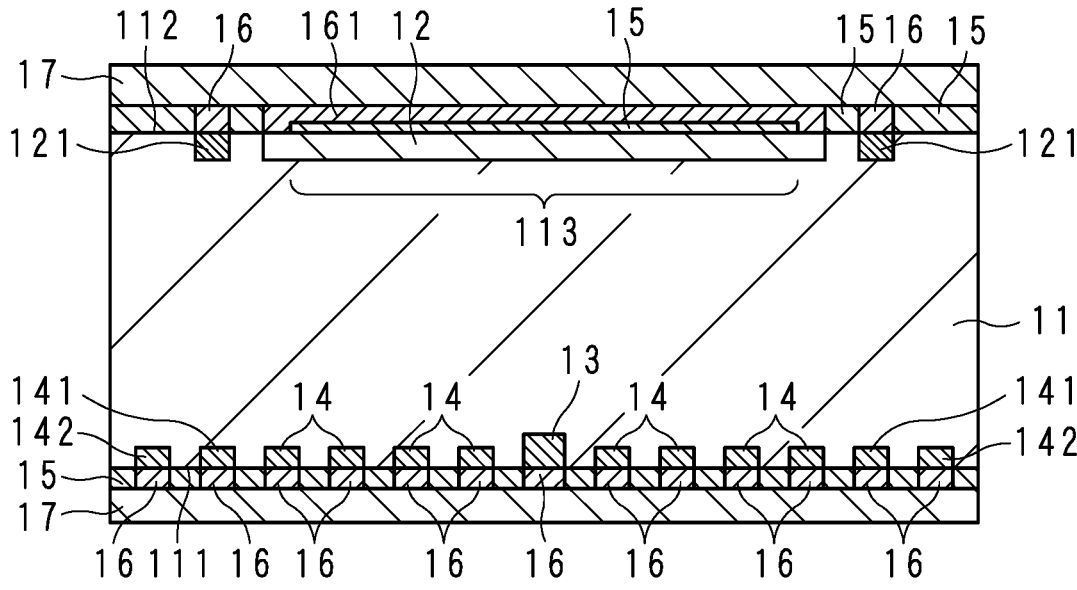

F I G.5 C
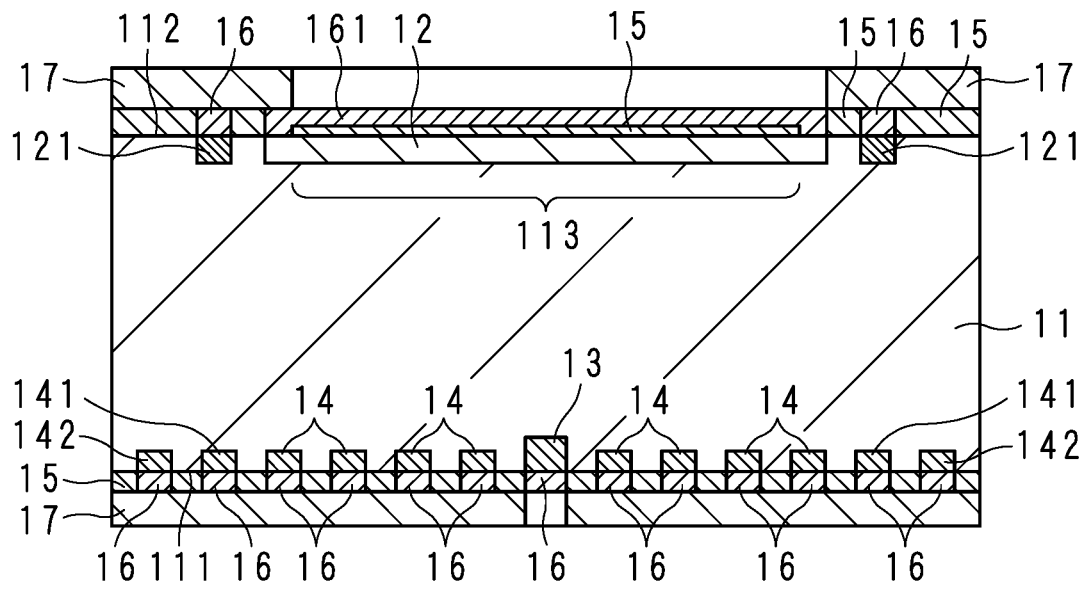

F I G. 6 A
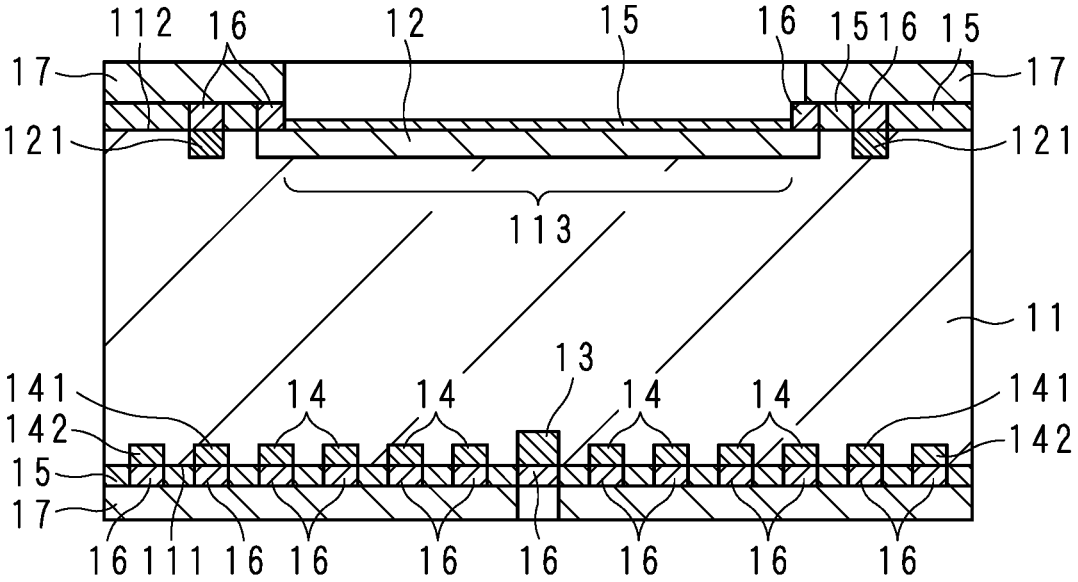
F I G. 6 B
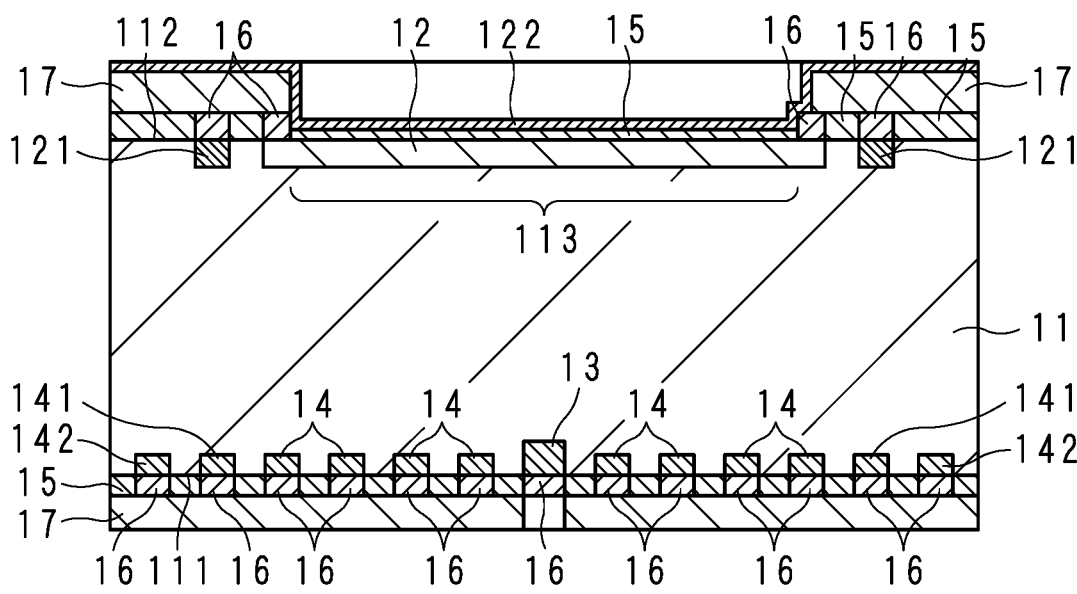

F I G.6 C
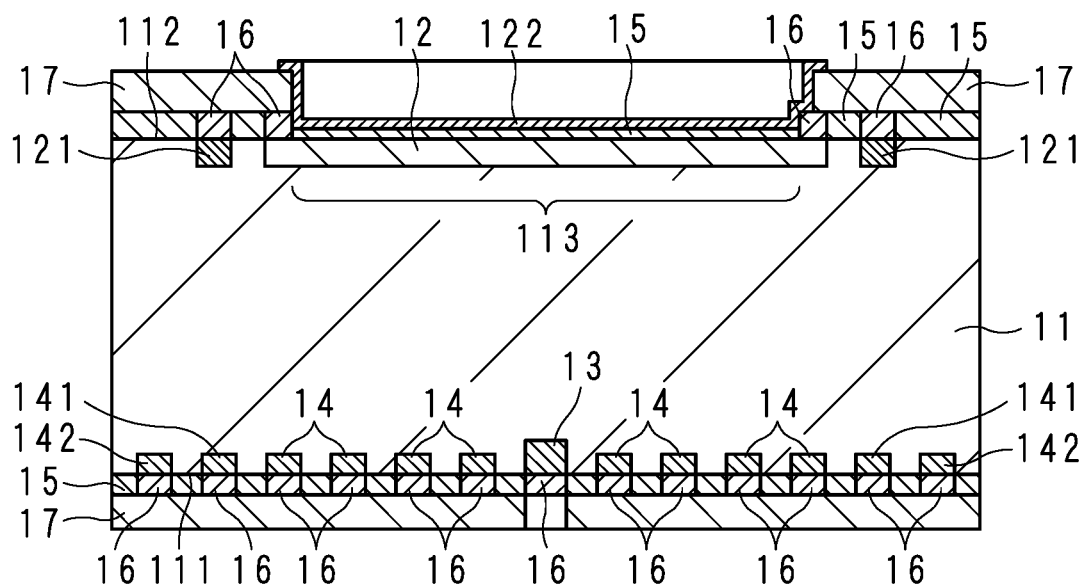

F I G.7
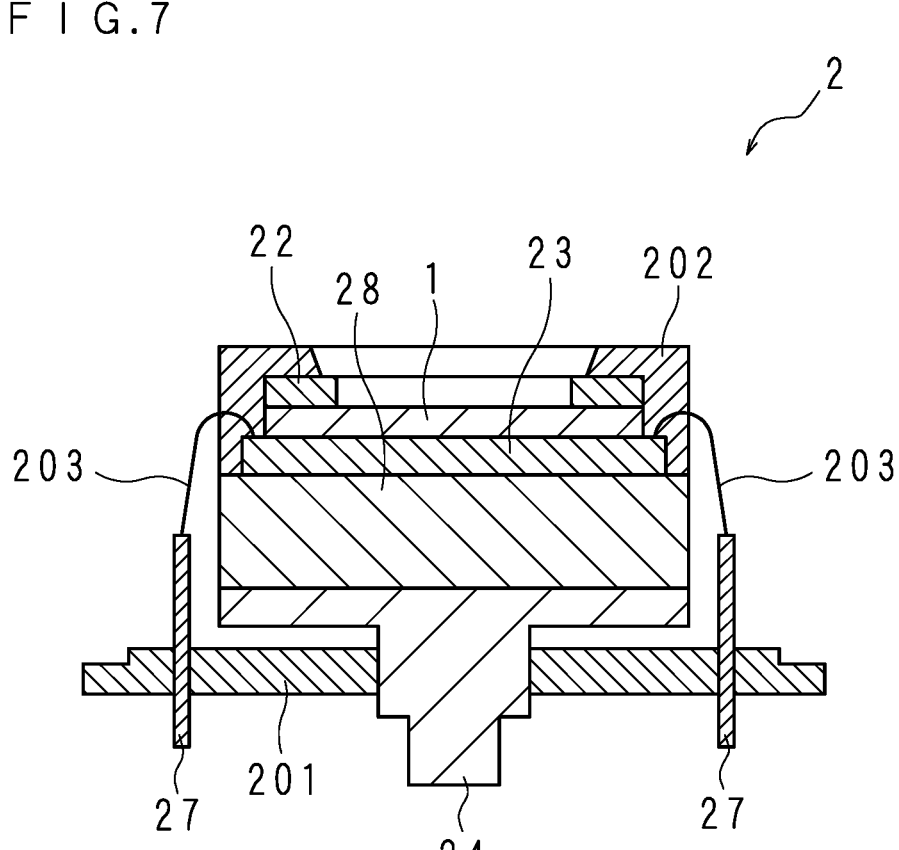

F I G.8
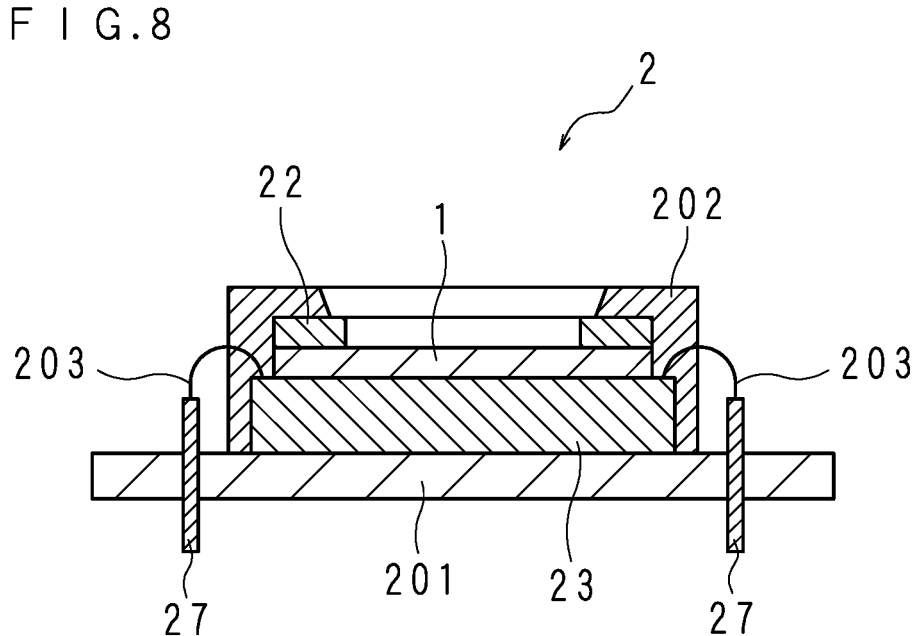

F I G . 9
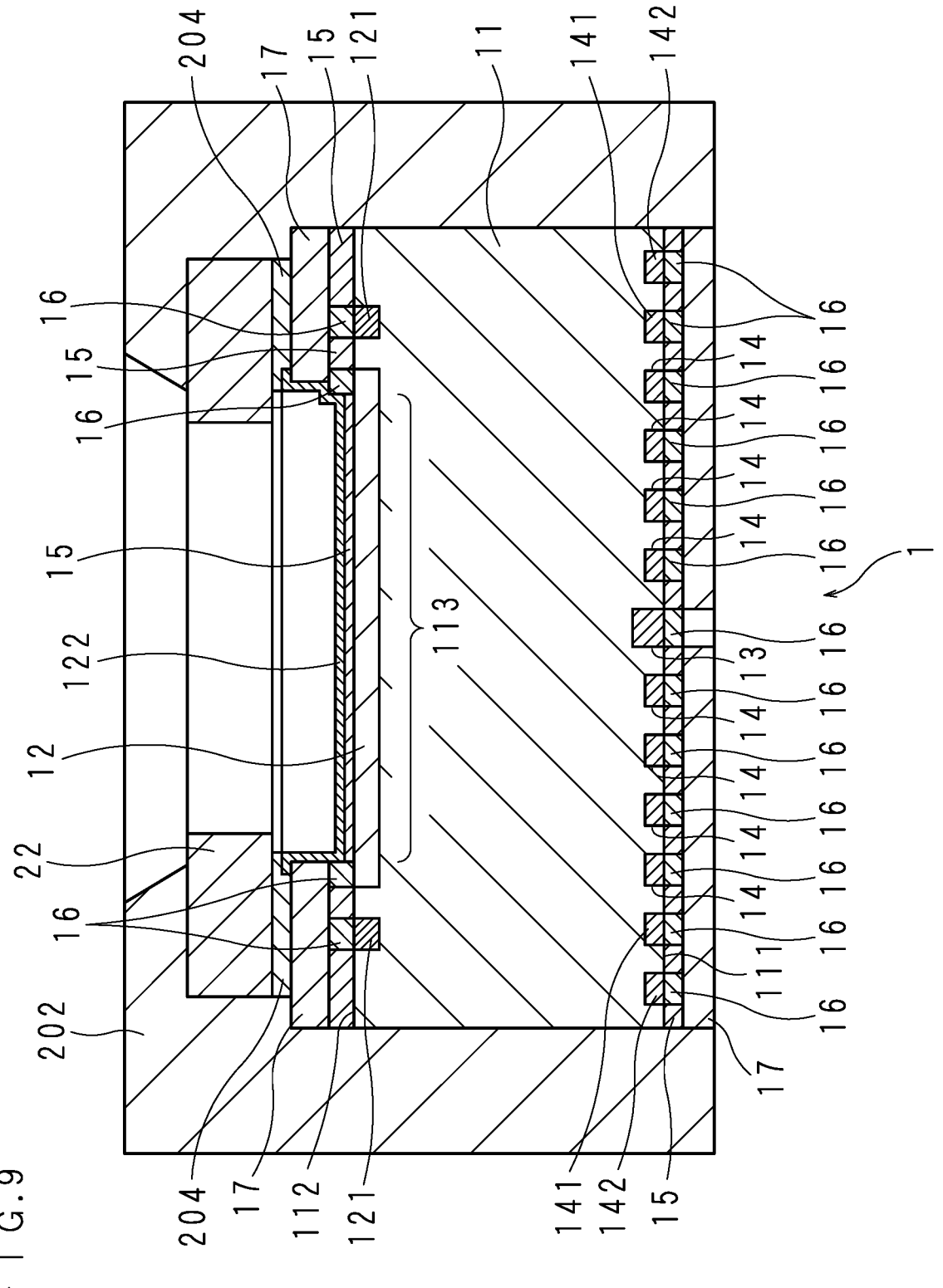

RADIATION DETECTION ELEMENT, RADIATION DETECTOR, RADIATION DETECTION DEVICE, AND METHOD FOR MANUFACTURING RADIATION DETECTION ELEMENT

CROSS REFERENCE TO RELATED APPLICATION

This Application is a 371 of PCT/JP2022/031152 filed on Aug. 18, 2022 which, in turn, claimed the priority of Japanese Patent Application No. 2021-137296 filed on Aug. 25, 2021, both applications are incorporated herein by reference.

FIELD

The present invention relates to a radiation detection element, a radiation detector, a radiation detection device, and a method for manufacturing a radiation detection element.

BACKGROUND

As a radiation detector that detects radiations such as X-rays, there is known a radiation detector including a radiation detection element using a semiconductor. A radiation detection element using a semiconductor has a plate-like shape, is mounted on a circuit board, and is disposed inside a housing provided in the radiation detector. The housing includes a window formed from a window material through which radiations are transmitted, and the radiation detection element is disposed so that one surface faces the window. The surface facing the window in the radiation detection element is an incidence surface to which the radiations are incident, and an electrode disposed on a rear surface of the incidence surface is covered with a protective film and is in contact with the circuit board through the protective film.

International Publication WO 2019/117272 discloses a radiation detector which does not include the window formed from the window material and in which a portion corresponding to the window of the housing is opened. In the radiation detector, radiations with low energy are likely to be incident to the radiation detection element, and detection sensitivity of the radiations is improved.

SUMMARY

In the radiation detection element in the related art, an incidence surface is not covered with a protective film. Therefore, characteristics of the radiation detection element may fluctuate due to external influences from the outside such as adhesion of water to an electrode provided on the incidence surface. Particularly, a radiation detector which does not include a window and in which a housing is opened is susceptible to influences from the outside, and characteristics of the radiation detection element are likely to fluctuate. Due to fluctuation in the characteristics of the radiation detection element, accuracy of radiation detection using the radiation detector may be unstable.

The disclosure has been made in consideration of such circumstances, and an object thereof is to provide a radiation detection element in which accuracy of radiation detection is stabilized, a radiation detector, a radiation detection device, and a method for manufacturing a radiation detection element.

A radiation detection element according to an aspect of the present disclosure, is characterized by comprising: a semiconductor part including an incidence surface to which radiations to be detected are incident; a first electrode provided on the incidence surface; and a second electrode that is provided on the incidence surface and is disposed at a position surrounding the periphery of the first electrode, wherein the radiation detection element is a silicon drift-type radiation detection element, and the radiation detection element is provided with an insulating protective film that covers the second electrode.

In an aspect of the present disclosure, in the radiation detection element, the second electrode that is disposed at a position surrounding the periphery of the first electrode provided on the incidence surface of the semiconductor part is covered with the insulating protective film. Foreign matters are less likely to adhere to the second electrode, and a fluctuation in the characteristics of the radiation detection element due to an influence of the adhered foreign matters is less likely to occur.

In the radiation detection element according to an aspect of the present disclosure, it is characterized in that the second electrode is an electrode configured to prevent dielectric breakdown between the first electrode and other portions.

In an aspect of the present invention, the second electrode that prevents dielectric breakdown between the first electrode and other portions is covered with the insulating protective film. A deterioration in the function of preventing the dielectric breakdown due to adhesion of foreign matters, and the fluctuation in the characteristics of the radiation detection element are prevented by the protective film.

The radiation detection element according to an aspect of the present disclosure, is characterized by further comprising a metal film that overlaps the first electrode.

In an aspect of the present disclosure, the metal film overlaps the first electrode. Suppression of contamination of a surface and light-shielding are performed by the metal film.

In the radiation detection element according to an aspect of the present disclosure, it is characterized in that the incidence surface includes an incidence region to which radiations to be detected are incident, the first electrode is provided in a region of the incidence surface which includes the incidence region, and the protective film does not overlap the incidence region.

In an aspect of the present disclosure, the first electrode is provided in a region including the incidence region to which radiations to be detected are incident, and the protective film does not overlap the incidence region. Since the radiations incident to the incidence region do not pass through the protective film, radiations with low energy can also be incident to the incidence region. Accordingly, radiations with low energy can be detected.

A radiation detector according to an aspect of the present disclosure, is characterized by comprising: the radiation detection element according to the present disclosure; and a circuit board on which the radiation detection element is mounted.

In an aspect of the present disclosure, the radiation detector includes the radiation detection element in which the second electrode is covered with the insulating protective film. Foreign matters contained in a gas that has entered the inside of the radiation detector from the outside are less likely to adhere to the second electrode, and the fluctuation in the characteristics of the radiation detection element due to an influence of adhered foreign matter is less likely to occur.

The radiation detector according to an aspect of the present disclosure, is characterized by further comprising: a housing that accommodates the radiation detection element and the circuit board, wherein the housing includes an opening that is not blocked, and the radiation detection element is disposed with the incidence surface facing the opening.

In an aspect of the present disclosure, the radiation detector includes the housing including an opening that is not blocked, and in the radiation detection element, the incidence surface faces the opening. Since the opening is not blocked with a window material, it is not necessary for radiations to be transmitted through the window material. Accordingly, the radiation detector can detect radiations which cannot be transmitted through the window material due to low energy.

The radiation detector according to an aspect of the present disclosure, is characterized by further comprising: a collimator that is disposed on the radiation detection element mounted on the circuit board; and a resin mold that covers a part of a surface of the collimator, a side surface of the collimator, a side surface of the radiation detection element, and a side surface of the circuit board, wherein the radiation detection element, the circuit board, the collimator, and the resin mold are not accommodated in the housing.

In an aspect of the present disclosure, since the collimator, the radiation detection element, and the circuit board are covered with the resin mold, the radiation detection element is protected by the resin mold, and the radiation detection element is further less likely to be damaged. Since the radiation detector does not accommodate the housing, a reduction in the size of the radiation detector is realized.

A radiation detection device according to an aspect of the present disclosure, is characterized by comprising: an irradiation unit that irradiates a sample with radiations; the radiation detector according to the present disclosure; a spectrum generation unit that generates a spectrum of radiations detected by the radiation detector; and a display unit that displays the spectrum generated by the spectrum generation unit.

In an aspect of the present disclosure, the radiation detection device includes the radiation detector including the radiation detection element in which the second electrode is covered with the insulating protective film. A fluctuation in the characteristics of the radiation detection element due to an influence from the outside is less likely to occur, and accuracy of radiation detection by the radiation detection device is stable.

A method according to an aspect of the present disclosure for manufacturing a radiation detection element including a semiconductor part including an incidence surface including an incidence region to which radiations to be detected are incident, a first electrode that is provided in a region including the incidence region of the incidence surface, and a second electrode that is provided on the incidence surface and is disposed at a position surrounding the periphery of the first electrode, the method is characterized by comprising: forming an insulating protective film that covers the first electrode and the second electrode; removing a portion of the protective film which overlaps the incidence region while leaving a portion of the protective film which covers the second electrode; and forming a metal film that overlaps the first electrode after removing the portion of the protective film which overlaps the incidence region.

In an aspect of the present disclosure, at the time of manufacturing the radiation detection element, the protective film that covers the first electrode and the second electrode is formed, a portion of the protective film which overlaps the incidence region is removed, and the metal film that overlaps the first electrode is formed. Since the metal film is formed after a portion of the protective film which overlaps the incidence region is removed, the metal film is not damaged when removing the protective film.

In the method for manufacturing a radiation detection element according to aspect of the present disclosure, it is characterized in that a metal layer that is connected to the first electrode is formed on an oxide film that overlaps the first electrode, the protective film is formed to overlap the metal layer, a portion of the protective film which overlaps the incidence region is removed while leaving the metal layer, a portion of the metal layer which overlaps the incidence region is removed after removing the portion of the protective film which overlaps the incidence region, and a metal film that overlaps the first electrode and the oxide film is formed after removing the portion of the metal layer which overlaps the incidence region.

In an aspect of the present disclosure, at the time of manufacturing the radiation detection element, the metal layer is formed on the oxide film that overlaps the first electrode, the protective film is formed to overlap the metal layer, a portion of the protective film which overlaps the incidence region is removed while leaving the metal layer. Then, a portion of the metal layer which overlaps the incidence region is removed, and the metal film is formed. Since the metal layer is removed after the protective film is removed, it is possible to use a method that does not damage the oxide film when removing the metal layer.

According to the present disclosure, a fluctuation in the characteristics of a radiation detection element due to an influence from the outside is less likely to occur, and accuracy of radiation detection is stable, and these excellent effects can be obtained.

The above and further objects and features will more fully be apparent from the following detailed description with accompanying drawings.

BRIEF DESCRIPTION OF THE DRAWINGS

FIG. 1 is a schematic cross-sectional view illustrating an example of a radiation detection element.

FIG. 2 is a block diagram illustrating a functional configuration example of a radiation detection device using the radiation detection element.

FIG. 3 is a schematic cross-sectional view illustrating a first example of a configuration of a radiation detector according to Embodiment 1 provided with the radiation detection element.

FIG. 4 is a schematic cross-sectional view illustrating a second example of the configuration of the radiation detector according to Embodiment 1.

FIG. 5A is a schematic cross-sectional view illustrating a method for manufacturing the radiation detection element.

FIG. 5B is a schematic cross-sectional view illustrating the method for manufacturing the radiation detection element.

FIG. 5C is a schematic cross-sectional view illustrating the method for manufacturing the radiation detection element.

FIG. 6A is a schematic cross-sectional view illustrating the method for manufacturing the radiation detection element.

FIG. 6B is a schematic cross-sectional view illustrating the method for manufacturing the radiation detection element.

FIG. 6C is a schematic cross-sectional view illustrating the method for manufacturing the radiation detection element.

FIG. 7 is a schematic cross-sectional view illustrating a first example of a configuration of a radiation detector according to Embodiment 2.

FIG. 8 is a schematic cross-sectional view illustrating a second example of the configuration of the radiation detector according to Embodiment 2.

FIG. 9 is a schematic cross-sectional view illustrating an example of the radiation detection element, a collimator, and a resin mold.

DETAILED DESCRIPTION

Embodiment 1

Hereinafter, the present disclosure will be described in detail on the basis of drawings illustrating embodiments.

FIG. 1 is a schematic cross-sectional view illustrating an example of a radiation detection element 1. The radiation detection element 1 is a silicon drift-type radiation detection element. The radiation detection element 1 has a flat plate shape as a whole. The radiation detection element 1 includes a plate-shaped semiconductor part 11 consisting of silicon (Si). A constituent of the semiconductor part 11 is an n-type Si. The semiconductor part 11 includes an incidence surface 112 located on an incidence side to which radiations to be detected are incident, and an electrode surface 111 located on a rear surface of the incidence surface 112.

A signal output electrode 13 as an electrode that outputs a signal during radiation detection is provided at the center of the electrode surface 111. A constituent of the signal output electrode 13 is the same type of Si as in the semiconductor part 11. For example, a constituent of the signal output electrode 13 is n+Si in which Si is doped with a specific dopant such as phosphorous. In addition, the electrode surface 111 is provided with a plurality of curved electrodes 14 having a multiple-ring shape. A constituent of the curved electrodes 14 is a semiconductor of a type different from the semiconductor part 11, and p-type Si in which Si is doped with a specific dopant such as boron. For example, the constituent of the curved electrodes 14 is p+Si. The plurality of curved electrodes 14 are substantially concentric, and the signal output electrode 13 is located approximately at the center of the plurality of curved electrodes 14. That is, the plurality of curved electrodes 14 surround the signal output electrode 13, and distances between the signal output electrode 13 and the curved electrodes 14 are different from each other.

Although four pieces of the curved electrodes 14 are shown in FIG. 1, more curved electrodes 14 are actually provided. Note that, a shape of the curved electrodes 14 may be a ring other than a circular ring, and the plurality of curved electrodes 14 may not be concentric. The shape of the curved electrodes 14 may be a shape in which a part of the ring is missing. The signal output electrode 13 may be disposed at a position other than the center of the plurality of curved electrodes 14, or may be disposed at a position other than the center of the electrode surface 111.

An annular guard ring electrode 141 is provided on an outer side of the plurality of curved electrodes 14, and an annular ground electrode 142 is provided on an outer side of the guard ring electrode 141. The ground electrode 142 is connected to a ground potential. A potential of the guard ring electrode 141 is a floating potential. The guard ring electrode 141 prevents dielectric breakdown between the curved electrodes 14 and the ground electrode 142. Although a single piece of the guard ring electrode 141 is shown in FIG. 1, a plurality of the guard ring electrodes 141 having a multiple annular shape are actually provided. Note that, the ground electrode 142 may not be provided, and a ground electrode may be provided on the incidence surface 112 side. In a case where the ground electrode 142 is not provided, the guard ring electrode 141 prevents dielectric breakdown between an edge of the semiconductor part 11 and the curved electrodes 14. It is necessary for a ground electrode to be provided at least one side of the electrode surface 111 side and the incidence surface 112 side.

The electrode surface 111 is covered with an oxide film 15 made of oxide of Si. A metal electrode 16 passing through the oxide film 15 is connected to the signal output electrode 13, the curved electrodes 14, the guard ring electrode 141, and the ground electrode 142. A constituent of the metal electrode 16 is, for example, aluminum. The oxide film 15 and the metal electrode 16 on the electrode surface 111 side are covered with an insulating protective film 17. However, the metal electrode 16 connected to the signal output electrode 13 is not covered with the protective film 17 for connection to the outside of the radiation detection element 1. A portion (not illustrated) that is not covered with the protective film 17 also exists in the metal electrode 16 connected to the curved electrodes 14 and the ground electrode 142 for connection to the outside of the radiation detection element 1.

A counter electrode 12 that is an electrode to which a voltage is applied is formed on the incidence surface 112. The counter electrode 12 corresponds to a first electrode. The counter electrode 12 is doped with a dopant that makes Si be a semiconductor in a type different from the type of the constituent of the semiconductor part 11. A constituent of the counter electrode 12 is p-type Si in which Si is doped with a specific dopant such as boron, and is, for example, p+Si. A part of the incidence surface 112 which includes the center of the incidence surface 112 is set as an incidence region 113 to which radiations to be detected are incident. The counter electrode 12 is formed in most of a region of the incidence surface 112 including the center of the incidence surface 112, and is provided over the entirety of the incidence region 113. For example, the shape of the counter electrode 12 is a circular shape in plan view.

An annular guard ring electrode 121 is provided on an outer side of the counter electrode 12. The guard ring electrode 121 is disposed at a position surrounding the periphery of the counter electrode 12. The guard ring electrode 121 corresponds to a second electrode. A potential of the guard ring electrode 121 is a floating potential. Although a single piece of the guard ring electrode 121 is shown in FIG. 1, a plurality of the guard ring electrodes 121 having multiple annular shapes are actually provided. The guard ring electrode 121 prevents dielectric breakdown between the edge of the semiconductor part 11 and the counter electrode 12. Note that, a ground electrode that is connected to the ground potential may be provided on an outer side of the guard ring electrode 121. In a case where the ground electrode is provided, the guard ring electrode 121 prevents dielectric breakdown between the counter electrode 12 and the ground electrode.

The guard ring electrodes 121 and 141 are semiconductors in a type different from the semiconductor part 11, and are p-type Si. For example, the constituent of the guard ring electrodes 121 and 141 is p+Si. The guard ring electrodes 121 and 141 are set to have the same polarity. Note that, the potential of the guard ring electrodes 121 and 141 may be a fixed potential.

The incidence surface 112 is covered with the oxide film 15 of Si. The metal electrode 16 passing through the oxide film 15 is connected to the guard ring electrode 121. The metal electrode 16 passing through the oxide film 15 is connected to an end of the counter electrode 12. A portion of the counter electrode 12 other than the end to which the metal electrode 16 is connected is provided in the incidence region 113. In addition, the oxide film 15 and the metal electrode 16 on the incidence surface 112 side are covered with the insulating protective film 17 except for a portion of the oxide film 15 that covers the incidence region 113. That is, the guard ring electrode 121 is covered with the protective film 17, and the protective film 17 does not overlap the incidence region 113. However, the part of the metal electrode 16 connected to the end of the counter electrode 12 is not covered with the protective film 17. A constituent of the protective film 17 is an oxide or a nitride of a metal or a semiconductor. For example, the constituent of the protective film 17 is an aluminum oxide. The protective film 17 may be formed by laminating a plurality of kinds of insulating films.

In addition, the portion of the oxide film 15 which covers the incidence region 113 is covered with a metal film 122. That is, the metal film 122 overlaps the counter electrode 12. A constituent of the metal film 122 is, for example, aluminum. The metal film 122 is connected to a part of the metal electrode 16 that is connected to the end of the counter electrode 12. Note that, the metal film 122 may not be connected to the counter electrode 12. The metal film 122 suppresses contamination of the portion of the oxide film 15 which covers the incidence region 113, and shields light.

A voltage is applied to the plurality of curved electrodes 14 in such a manner that a potential of an innermost curved electrode 14 is highest, and a potential of an outermost curved electrode 14 is lowest. In addition, the radiation detection element 1 is configured so that predetermined electrical resistance is generated between adjacent curved electrodes 14 in which distances from the signal output electrode 13 are different from each other. For example, an electrical resistance channel to which two pieces of the curved electrodes 14 are connected is formed by adjusting a constituent of a portion located between the adjacent curved electrodes 14. That is, the plurality of curved electrodes 14 are connected in a string through the electrical resistance. When a voltage is applied, the curved electrodes 14 have a potential that sequentially and monotonically increases from the curved electrode 14 on an outer side toward the curved electrode 14 on an inner side. That is, the potential of the curved electrodes 14 sequentially increases from a curved electrode 14 farthest from the signal output electrode 13 to a curved electrode 14 closest to the signal output electrode 13. Note that, a pair of adjacent curved electrodes 14 having the same potential may be included in the plurality of curved electrodes 14.

Due to the potential of the plurality of curved electrodes 14, an electrical field (potential gradient), in which a potential becomes higher as being closer to the signal output electrode 13 and the potential becomes lower as being farther from the signal output electrode 13, is generated in the semiconductor part 11. In addition, a voltage is applied to the counter electrode 12 so that a potential of the counter electrode 12 becomes a potential between the innermost curved electrode 14 and the outermost curved electrode 14.

In this manner, an electrical field in which the potential becomes higher as being closer to the signal output electrode 13 is generated inside the semiconductor part 11. Since the counter electrode 12 is provided at the entirety of the incidence region 113, the electrical field is generated within a range to which radiations are incident through the incidence region 113 in the semiconductor part 11.

Radiations such as X-rays, general photons (including UV and visible light), electron beams, and other charged particle beams are incident to the radiation detection element 1. The radiations are incident to the inside of the semiconductor part 11 mainly through the incidence region 113 of the incidence surface 112. Charges in an amount corresponding to energy of the radiations absorbed into the semiconductor part 11 are generated inside the semiconductor part 11. The generated charges are electrons and holes. The generated charges are moved by the electrical field inside the semiconductor part 11, and one type of charges flow into the signal output electrode 13 in a concentrated manner. In this embodiment, electrons generated due to incidence of the radiations move, and flow into the signal output electrode 13. The charges flowing into the signal output electrode 13 are output as a current signal.

FIG. 2 is a block diagram illustrating a functional configuration example of a radiation detection device 100 using the radiation detection element 1. The radiation detection device 100 is, for example, a fluorescent X-ray analysis device. The radiation detection device 100 includes an irradiation unit 4 that irradiates a sample 6 with radiations such as electron beams or X-rays, a sample stage 5 on which the sample 6 is mounted, and a radiation detector 2. The radiation detector 2 includes the radiation detection element 1 and a preamplifier 21. The preamplifier 21 is connected to the signal output electrode 13 of the radiation detection element 1. A signal output from the signal output electrode 13 is input to the preamplifier 21. The preamplifier 21 converts a current signal into a voltage signal. The preamplifier 21 outputs a signal with an intensity corresponding to energy of the radiations. Note that, a part of the preamplifier 21 may be included inside the radiation detector 2 and the other portion may be disposed at the outside of the radiation detector 2.

When the sample 6 is irradiated with radiations from the irradiation unit 4, radiations such as fluorescent X-rays are generated in the sample 6, and the radiation detector 2 detects the radiations generated from the sample 6. In FIG. 2, the radiations are indicated by an arrow. The radiation detector 2 outputs a signal proportional to energy of the detected radiations. Note that, the radiation detection device 100 may be set to an aspect in which the sample 6 is held by a method other than the method in which the sample 6 is mounted on the sample stage 5.

A voltage application unit 31, and a signal processing unit 32 that processes a signal that is output are connected to the radiation detector 2. The voltage application unit 31 is connected to the radiation detection element 1. The voltage application unit 31 applies a voltage to the curved electrodes 14 and the counter electrode 12. The signal processing unit 32 is connected to the preamplifier 21. When the preamplifier 21 outputs a signal, the radiation detector 2 outputs a signal with an intensity corresponding to energy of radiations. The signal processing unit 32 receives the signal output from the radiation detector 2, and detects the intensity of the signal to detect a signal value corresponding to the energy of the radiations detected by the radiation detector 2. An analysis unit 34 is connected to the signal processing unit 32. The analysis unit 34 includes an arithmetic operation unit that performs arithmetic operation, and a memory that store data. The voltage application unit 31, the signal processing unit 32, the analysis unit 34, and the irradiation unit 4 are connected to a control unit 33. The control unit 33 controls operations of the voltage application unit 31, the signal processing unit 32, the analysis unit 34, and the irradiation unit 4.

The signal processing unit 32 outputs data indicating a detected signal value to the analysis unit 34. The analysis unit 34 counts signals of respective values on the basis of the data transmitted from the signal processing unit 32, and performs processing of generating a relationship between energy of radiations and the number of counts, that is, a spectrum of the radiations. The signal processing unit 32 may generate the spectrum of the radiations. The signal processing unit 32 and the analysis unit 34 correspond to a spectrum generation unit. The analysis unit 34 performs qualitative analysis or quantitative analysis of elements contained in the sample 6 on the basis of the spectrum. A display unit 35 such as a liquid crystal display is connected to the analysis unit 34. The display unit 35 displays the spectrum generated by the analysis unit 34 and analysis results obtained by the analysis unit 34. The control unit 33 may accept a user's operation, and may control respective units of the radiation detection device 100 in response to the accepted operation. In addition, the control unit 33 and the analysis unit 34 may be configured by the same computer.

In the example illustrated in FIG. 2, an aspect in which the sample 6 is irradiated with radiations, and radiations generated from the sample 6 are detected is illustrated, but the radiation detection device 100 may detect radiations transmitted through the sample 6 or radiations reflected from the sample 6. The radiation detection device 100 may scan a sample with radiations by changing a direction of the radiations. The radiation detection device 100 may not include the irradiation unit 4, the analysis unit 34, or the display unit 35.

FIG. 3 is a schematic cross-sectional view illustrating a first example of the configuration of the radiation detector 2 according to Embodiment 1 provided with the radiation detection element 1. The radiation detector 2 is a silicon drift detector (SDD). The radiation detector 2 includes a housing 25 having a shape in which a truncated cone is connected to one end of a cylinder. The housing 25 is constructed by covering a plate-shaped bottom plate with a cap-shaped cover. An opening 251 is formed at a tip end of the housing 25. A window containing a window material is not provided at the opening 251, and the opening 251 is not blocked. The radiation detection element 1, a collimator 22, a circuit board 23, a cooling unit 28, and a cold finger 24 are disposed inside the housing 25. The housing 25 accommodates the radiation detection element 1, the collimator 22, the circuit board 23, and the cooling unit 28. The cooling unit 28 is, for example, a Peltier element.

The radiation detection element 1 is mounted on a surface of the circuit board 23, and is disposed at a position facing the opening 251. The radiation detection element 1 is disposed in such a manner that the electrode surface 111 faces the circuit board 23, and the incidence surface 112 faces the opening 251. The collimator 22 has a cylindrical shape of which both ends are opened and is formed from a material that shields radiations. The collimator 22 is disposed between the radiation detection element 1 and the opening 251. One end of the collimator 22 faces the opening 251, and the other end faces the surface of the radiation detection element 1. Radiations are incident to an inner side of the housing 25 mainly through the opening 251, and the collimator 22 shields a part of the radiations. A portion of the incidence surface 112 other than the incidence region 113 is covered with the collimator 22 that shields the radiations, and thus the radiations are not incident thereto. The incidence region 113 is not covered with the collimator 22, and the radiations are incident thereto. The radiation detection element 1 detects the radiations which are incident without being shielded by the collimator 22.

A circuit is formed in the circuit board 23, and the preamplifier 21 is mounted in the circuit board 23. In FIG. 3, the preamplifier 21 is omitted. A rear surface of the circuit board 23 is in thermal contact with a heat absorbing portion of the cooling unit 28 in a direct manner or through an interposed object. A heat dissipating portion of the cooling unit 28 is in thermal contact with the cold finger 24. The cold finger 24 includes a flat plate-shaped portion with which the heat dissipating portion of the cooling unit 28 is in thermal contact, and a portion penetrating through the bottom plate portion of the housing 25. Heat of the radiation detection element 1 is absorbed to the cooling unit 28 through the circuit board 23, is transferred from the cooling unit 28 to the cold finger 24, and is dissipated to the outside of the radiation detector 2 through the cold finger 24.

The radiation detector 2 includes a plurality of lead pins 27 penetrating the bottom plate portion of the housing 25. The lead pins 27 are connected to the circuit board 23 by a method such as wire bonding. Voltage application to the radiation detection element 1 by the voltage application unit 31, and signal output from the preamplifier 21 are performed through the lead pins 27. Note that, the radiation detector 2 may further include other components.

FIG. 4 is a schematic cross-sectional view illustrating a second example of the configuration of the radiation detector 2 according to Embodiment 1. In the second example, the radiation detector 2 does not include the cooling unit 28 and the cold finger 24. The rear surface of the circuit board 23 is in thermal contact with the bottom plate portion of the housing 25 in a direct manner or through an interposed object. Heat of the radiation detection element 1 is transferred to the bottom plate portion of the housing 25 through the circuit board 23, and is dissipated to the outside of the radiation detector 2 from the bottom plate portion. Even in the second example, radiations are incident to an inner side of the housing 25 mainly through the opening 251, and are incident to the incidence region 113 of the radiation detection element 1. The radiation detection element 1 detects the incident radiations. The radiation detector 2 may not include the collimator 22.

In this embodiment, the radiations passing mainly through the opening 251 are incident to the radiation detection element 1 and are detected. Since the opening 251 is not blocked with the window material, it is not necessary for the radiations to be transmitted through the window material. Accordingly, radiations which cannot be transmitted through the window material due to low energy can also be incident to the radiation detection element 1. According to this, the radiation detection device 100 can detect radiations which cannot be transmitted through the window material due to low energy. For example, it is possible to detect elements with low energy of fluorescent X-rays by detecting the fluorescent X-rays with low energy.

In the radiation detector 2, since the opening 251 is not blocked, gases such as the air enter the inner side of the housing 25 through the opening 251. There is a possibility that foreign matters such as water and dust included in the intruded gas may adhere to the radiation detection element 1. In a radiation detection element in the related art, a guard ring electrode is not covered with a protective film. Therefore, there is a problem that foreign matters included in the intruded gas adhere to the guard ring electrode, characteristics of the radiation detection element fluctuates due to an influence of the adhered foreign matters, and accuracy of radiation detection performed by the radiation detection device becomes unstable.

In this embodiment, the guard ring electrode 121 is covered with the protective film 17. Accordingly, foreign matters included in a gas entering from the outside are less likely to directly adhere to the guard ring electrode 121, and the fluctuation in the characteristics of the radiation detection element 1 due to an influence of directly adhered foreign matters is less likely to occur. For example, a deterioration in a function of preventing of dielectric breakdown between the edge of the semiconductor part 11 and the counter electrode 12 by the guard ring electrode 121 due to an influence of foreign matters and the fluctuation in the characteristics of the radiation detection element 1 due to the dielectric breakdown are prevented. As described above, the fluctuation in the characteristics of the radiation detection element 1 due to an influence from the outside is less likely to occur, and accuracy of radiation detection performed by the radiation detection device 100 becomes stable. In addition, the incidence region 113 is not covered with the protective film 17. Since radiations incident to the incidence region 113 do not pass through the protective film 17, radiations with low energy can also be incident to the incidence region 113. Accordingly, the radiation detection device 100 can detect radiations with low energy. As described above, the radiation detection device 100 according to this embodiment can detect radiations with low energy, and accuracy of radiation detection can be stabilized.

A method for manufacturing the radiation detection element 1 will be described. FIG. 5A, FIG. 5B, FIG. 5C, FIG. 6A, FIG. 6B, and FIG. 6C are schematic cross-sectional views illustrating the method for manufacturing the radiation detection element 1. As illustrated in FIG. 5A, the counter electrode 12, the guard ring electrode 121, the signal output electrode 13, the curved electrodes 14, the guard ring electrode 141, the ground electrode 142, and the oxide film 15 are formed in the semiconductor part 11. More specifically, the oxide film 15 that covers the incidence surface 112 and the electrode surface 111 is formed by thermal oxidation of the semiconductor part 11. Portions of the oxide film 15 at appropriate positions are removed by etching, and the counter electrode 12, the guard ring electrode 121, the signal output electrode 13, the curved electrodes 14, the guard ring electrode 141, and the ground electrode 142 are formed by ion injection. Activation annealing for recovering crystal damage occurred due to the ion injection is performed. Then, a metal layer that covers both surfaces is formed. For example, the metal layer is formed by sputtering a metal such as aluminum onto both the surfaces. Patterning is performed by photolithography to etch the metal layer, thereby forming the metal electrode 16. At this time, a metal layer 161 that overlaps the counter electrode 12 is not etched. Accordingly, the metal layer 161 that overlaps counter electrode 12 remains. Particularly, the metal layer 161 overlaps the incidence region 113.

Next, as illustrated in FIG. 5B, the protective film 17 is formed on both the surfaces. The protective film 17 is formed by plasma chemical vapor deposition (CVD). The protective film 17 is formed on one side at a time. The oxide film 15 and the metal electrode 16 located on the electrode surface 111 side are covered with the protective film 17. In addition, the oxide film 15, the metal electrode 16, and the metal layer 161 located on the incidence surface 112 side are covered with the protective film 17. In the related art, the protective film 17 is not formed on the incidence surface 112 side.

Next, as illustrated in FIG. 5C, patterning is performed on the electrode surface 111 side by photolithography to etch a part of the protective film 17. At this time, a part of the protective film 17 that covers the metal electrode 16 is removed by etching for connection between the outside of the radiation detection element 1 and the metal electrode 16. Specifically, in the protective film 17, a portion covering the metal electrode 16 connected to the signal output electrode 13 is removed by etching. In addition, in the protective film 17, a portion covering a part of the metal electrode 16 connected to the curved electrodes 14 and the ground electrode 142 is also removed by etching.

In addition, patterning is performed on the incidence surface 112 side by photolithography to etch a part of the protective film 17. Specifically, a portion of the protective film 17 which overlaps the incidence region 113 is removed by etching. Accordingly, the metal layer 161 that overlaps the incidence region 113 is exposed. At a portion of the protective film 17 which overlaps the counter electrode 12 and does not overlap the incidence region 113, a part is removed, and the other part may remain without being removed. That is, a part of the metal layer 161 may be covered with the protective film 17. During the etching, the protective film 17 is removed while remaining the metal layer 161. In a case of performing wet etching, an etchant is adjusted so that only the protective film 17 is etched while remaining the metal layer 161. For example, the etchant is prepared by appropriately combining water, ammonium fluoride, and acetic acid. In addition, a portion of the protective film 17 which covers the guard ring electrode 121 remains without being removed.

Next, as illustrated in FIG. 6A, patterning is performed on the incidence surface 112 side by photolithography to remove a portion of the metal layer 161 which overlaps the incidence region 113 by etching. In the metal layer 161, a portion that overlaps the counter electrode 12 and does not overlap the incidence region 113 is not removed, and remains as the metal electrode 16 connected to the counter electrode 12.

Next, as illustrated in FIG. 6B, the metal film 122 is formed. For example, the metal film 122 is formed by sputtering a metal such as aluminum to the incidence surface 112 side. The metal film 122 covers a surface on the incidence surface 112 side. The metal film 122 is formed in a thickness smaller than that of the metal layer 161. For example, the thickness of the metal film 122 is approximately ¹/₁₀ times the thickness of the metal layer 161.

Next, as illustrated in FIG. 6C, patterning is performed on the incidence surface 112 side by photolithography to remove a portion of the metal film 122 which overlaps the guard ring electrode 121 by etching. In the metal film 122, a portion other than a portion that overlaps the incidence region 113 is removed by etching. Accordingly, the guard ring electrode 121 is not covered with the metal film 122. The metal film 122 covers a portion of the oxide film 15 which overlaps the counter electrode 12. The metal film 122 overlaps the incidence region 113. In addition, in the metal electrode 16, a part of the portion that is connected to the counter electrode 12 is covered with the metal film 122 and is connected to the metal film 122. In the manner as described above, the radiation detection element 1 as illustrated in FIG. 1 is manufactured.

As described above, in this embodiment, the protective film 17 that covers the guard ring electrode 121 is formed on the incidence surface 112 side of the semiconductor part 11, and portions of the protective film 17 and the metal layer 161 which overlap the incidence region 113 are removed, and then, the metal film 122 is formed. The metal film 122 covers the oxide film 15 provided in the incidence region 113 and overlaps the counter electrode 12. The metal film 122 plays a role of suppressing contamination of the oxide film 15 provided in the incidence region 113 and a role of shielding light. In a case where the protective film 17 is formed after the metal film 122 is formed, and a portion of the protective film 17 which overlaps the incidence region 113 is removed, there is a risk that the metal film 122 may be damaged when removing the protective film 17. In this embodiment, since the metal film 122 is formed after removing a portion of the protective film 17 which overlaps the incidence region 113, the metal film 122 is not damaged. Therefore, a decrease in a yield rate of the radiation detection element 1 is suppressed.

In addition, in this embodiment, when removing portions of the protective film 17 and the metal layer 161 which overlap the incidence region 113, the protective film 17 is removed in a state in which the metal layer 161 remains, and then, the metal layer 161 is removed. In a case where the protective film 17 and the metal layer 161 are collectively removed by etching, there is a risk that the oxide film 15 overlapping the incidence region 113 may be damaged. In this embodiment, since the metal layer 161 is removed after removing the protective film 17, it is possible to use a method that does not damage the oxide film 15 when removing the metal layer 161. Accordingly, the oxide film 15 that overlaps the incidence region 113 is not damaged, and a decrease in the yield rate of the radiation detection element 1 is suppressed.

In this embodiment, although an aspect in which the radiation detector 2 does not include the window containing the window material is illustrated, the radiation detector 2 may be provided with the window containing the window material. In this embodiment, although an aspect in which the radiation detector 2 includes the collimator 22, the radiation detector 2 may not include the collimator 22. In this embodiment, although an aspect in which the radiation detection element 1 is accommodated in the housing 25 is illustrated, the radiation detector 2 may not include the housing 25.

Embodiment 2

FIG. 7 is a schematic cross-sectional view illustrating a first example of a configuration of a radiation detector 2 according to Embodiment 2. The radiation detector 2 does not include a housing, and includes a flat plate-shaped stem 201. The cold finger 24 includes a flat plate-shaped portion with which the heat dissipating portion of the cooling unit 28 is in thermal contact, and a portion penetrating through the stem 201. The lead pins 27 penetrate through the stem 201. The lead pins 27 are connected to the circuit board 23 through wires 203. The radiation detector 2 includes a resin mold 202 that covers a part of a surface of the collimator 22, a side surface of the collimator 22, a side surface of the radiation detection element 1, and a side surface of the circuit board 23.

FIG. 8 is a schematic cross-sectional view illustrating a second example of the configuration of the radiation detector 2 according to Embodiment 2. In the second example, the radiation detector 2 does not include a cooling unit 28 and a cold finger 24. The rear surface of the circuit board 23 is in thermal contact with the stem 201 in a direct manner or through an interposed object. The lead pins 27 penetrate through the stem 201. The lead pins 27 are connected to the circuit board 23 through wires 203. As in the first example, the radiation detector 2 includes the resin mold 202.

FIG. 9 is a schematic cross-sectional view illustrating an example of the radiation detection element 1, the collimator 22, and the resin mold 202. A configuration of the radiation detection element 1 is similar to Embodiment 1. The collimator 22 has a cylindrical shape of which both ends are opened as in Embodiment 1. The collimator 22 is disposed in a similar manner as in Embodiment 1. The collimator 22 is disposed on the radiation detection element 1 mounted on the circuit board 23. The collimator 22 is bonded to the radiation detection element 1 through adhesive 204. An inner diameter of the collimator 22 is smaller than a diameter of the incidence region 113 of the radiation detection element 1. A peripheral edge portion of the incidence region 113 is covered with the collimator 22, but many portions of the incidence region 113 including the center of the incidence region 113 are not covered with the collimator 22.

The resin mold 202 covers a part of a surface of the collimator 22. An outer edge of the surface of the collimator 22 is covered with the resin mold 202. An inner edge of the surface of the collimator 22 is not covered with the resin mold 202. A portion of the surface of the collimator 22 which is covered with the resin mold 202 is a portion on an outer side in comparison to the inner edge. Accordingly, in the incidence region 113 of the radiation detection element 1, a portion that is not covered with the collimator 22 is not covered with the resin mold 202.

A side surface of the collimator 22 is covered with the resin mold 202. In a case where a portion that is not covered with the collimator 22 exists in the incidence surface 112 of the radiation detection element 1, the portion of the incidence surface 112 which is not covered with the collimator 22 is covered with the resin mold 202. A side surface of the radiation detection element 1 is covered with the resin mold 202. In the circuit board 23, a portion on which the radiation detection element 1 is not mounted is covered with the resin mold 202. A portion of the circuit board 23 to which the wire 203 is connected is also covered with the resin mold 202. A side surface of the circuit board 23 is covered with the resin mold 202. Since the radiation detector 2 does not include the housing, the collimator 22, the radiation detection element 1, the circuit board 23, and the resin mold 202 are not accommodated in the housing.

In Embodiment 2, since the collimator 22, the radiation detection element 1, and the circuit board 23 are covered with the resin mold 202, the radiation detection element 1 is protected by the resin mold 202, and thus the radiation detection element 1 is less likely to be damaged. Accordingly, handling of the radiation detector 2 becomes easy. In addition, chemical resistance and mechanical strength of the radiation detection element 1 are improved. The versatility of the radiation detector 2 is improved such as being able to be used in harsher environment in comparison to the related art. Since the radiation detector 2 does not include the housing, a reduction in the size of the radiation detector 2 becomes possible.

Even in Embodiment 2, the guard ring electrode 121 of the radiation detection element 1 is covered with the protective film 17. As in Embodiment 1, foreign matters included in a gas are less likely to adhere to the guard ring electrode 121. In addition, the collimator 22 or the resin mold 202 does not come into direct contact with the guard ring electrode 121 due to the protective film 17. Accordingly, the guard ring electrode 121 is not damaged due to contact with the collimator 22 or the resin mold 202. In addition, a mechanical stress that occurs when the resin mold 202 is hardened is mitigated by the protective film 17, and thus damage of the guard ring electrode 121 due to the mechanical stress is prevented. Accordingly, a fluctuation in the characteristics of the radiation detection element 1 due to the damage of the guard ring electrode 121 is prevented, and accuracy of radiation detection by the radiation detection device 100 becomes stable.

In Embodiment 2, although an aspect in which a part of the surface of the collimator 22, the side surface of the collimator 22, the side surface of the radiation detection element 1, and the side surface of the circuit board 23 are covered with the resin mold 202 is illustrated, more portions may be covered by the resin mold 202. For example, in the radiation detector 2, a portion of the lead pins 27 which protrudes above the stem 201, and the wires 203 may also be covered with the resin mold 202. For example, in the radiation detector 2, the resin mold 202 covers the stem 201.

Note that, in Embodiments 1 and 2, although an aspect in which the radiation detection element 1 includes a set of the signal output electrode 13, the plurality of curved electrodes 14, and counter electrode 12 is illustrated, the radiation detection element 1 may include a plurality of sets of the signal output electrode 13, the plurality of curved electrodes 14, and the counter electrode 12. In Embodiments 1 and 2, although an aspect in which a semiconductor constituting the radiation detection element 1 is Si is illustrated, the radiation detection element 1 may consist of a semiconductor other than Si. In Embodiments 1 and 2, although an aspect in which the semiconductor part 11 consists of an n-type semiconductor, and the counter electrode 12 consists of a p-type semiconductor is illustrated, in the radiation detection element 1, the semiconductor part 11 may consist of a p-type semiconductor, and the counter electrode 12 may consist of an n-type semiconductor. In Embodiments 1 and 2, although an aspect in which the radiation detection element 1 is a silicon drift-type radiation detection element is illustrated, the radiation detection element 1 may be an element other than the silicon drift-type radiation detection element as long as the radiation detection element 1 is an element consisting of a semiconductor. Accordingly, the radiation detector 2 may be a radiation detector other than the SDD.

Configurations described in the respective embodiments can be combined with each other. In addition, independent claims and dependent claims described in the appended claims may be combined with each other in all combinations regardless of a citing format. In addition, although the appended claims use a format in which a claim cites two or more different claims (multi-claims format) in description, but there is no limitation thereto. A multi-claim format that cites at least one multi-claim (multi-multi-claim) may be used in description.

The present invention is not limited to the contents of the above-described embodiment, and various modifications can be made within a range shown in the appended claims. That is, an embodiment obtained by combining technical means that is appropriately changed within the range shown in the appended claims is also included in the technical scope of the present invention.

DESCRIPTION OF REFERENCE NUMERALS

It is to be noted that, unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims.

The invention claimed is:

1. A radiation detection element, comprising:
   a semiconductor part including an incidence surface to which radiations to be detected are incident;
   a first electrode provided on the incidence surface;
   a second electrode that is provided on the incidence surface and is disposed at a position surrounding the periphery of the first electrode;
   an oxide film that covers the incidence surface; and
   a metal electrode that extends through the oxide film and is connected to the second electrode,
   wherein the radiation detection element is a silicon drift-type radiation detection element, and
   the radiation detection element is provided with an insulating protective film that covers the oxide film and the metal electrode.

2. The radiation detection element according to claim 1, wherein the second electrode is an electrode configured to prevent dielectric breakdown between the first electrode and other portions.

3. The radiation detection element according to claim 1, further comprising:
   a metal film that overlaps the first electrode.

4. The radiation detection element according to claim 1, wherein the incidence surface includes an incidence region to which radiations to be detected are incident,
   the first electrode is provided in a region of the incidence surface which includes the incidence region, and
   the protective film does not overlap the incidence region.

5. The radiation detection element according to claim 4, wherein the oxide film covers the incidence region of the incidence surface and is disposed between the protective film and the semiconductor part in a region outside of the incidence region.

6. A radiation detector, comprising:
   the radiation detection element according to claim 1; and
   a circuit board on which the radiation detection element is mounted.

7. The radiation detector according to claim 6, further comprising:
   a housing that accommodates the radiation detection element and the circuit board,
   wherein the housing includes an opening that is not blocked, and
   the radiation detection element is disposed with the incidence surface facing the opening.

8. The radiation detector according to claim 6, further comprising:
   a collimator that is disposed on the radiation detection element mounted on the circuit board; and a resin mold that covers a part of a surface of the collimator, a side surface of the collimator, a side surface of the radiation detection element, and a side surface of the circuit board, wherein the radiation detection element, the circuit board, the collimator, and the resin mold are not accommodated in the housing.

9. A radiation detection device, comprising:

an irradiation unit that irradiates a sample with radiations;

the radiation detector according to claim 6;

a spectrum generation unit that generates a spectrum of radiations detected by the radiation detector; and a display unit that displays the spectrum generated by the spectrum generation unit.

10. A method for manufacturing a radiation detection element having a semiconductor part including an incidence surface including an incidence region to which radiations to be detected are incident, a first electrode that is provided in a region including the incidence region of the incidence surface, and a second electrode that is provided on the incidence surface and is disposed at a position surrounding the periphery of the first electrode, the method comprising:

forming an insulating protective film that covers the first electrode and the second electrode;

removing a portion of the protective film which overlaps the incidence region while leaving a portion of the protective film which covers the second electrode; and forming a metal film that overlaps the first electrode after removing the portion of the protective film which overlaps the incidence region.

11. The method for manufacturing a radiation detection element according to claim 10, wherein a metal layer that is connected to the first electrode is formed on the oxide film that overlaps the first electrode, the protective film is formed to overlap the metal layer, a portion of the protective film which overlaps the incidence region is removed while leaving the metal layer, a portion of the metal layer which overlaps the incidence region is removed after removing the portion of the protective film which overlaps the incidence region, and a metal film that overlaps the first electrode and the oxide film is formed after removing the portion of the metal layer which overlaps the incidence region.

* * * * *